US010333533B1

(12) United States Patent
Moscone

(10) Patent No.: US 10,333,533 B1
(45) Date of Patent: Jun. 25, 2019

(54) HYBRID PHASE INTERPOLATOR TO CORRECT INTEGRAL NON-LINEARITY

(71) Applicant: Cadence Design Systems, Inc., San Jose, CA (US)

(72) Inventor: Christopher George Moscone, Cary, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/134,656

(22) Filed: Sep. 18, 2018

(51) Int. Cl.
H03L 7/099 (2006.01)

(52) U.S. Cl.
CPC ................... H03L 7/0998 (2013.01)

(58) Field of Classification Search
CPC ..... H04L 7/0025; H04L 7/0807; H04L 7/033; H03L 7/0998; H03K 3/0315
USPC .................. 327/115, 162, 172, 231
See application file for complete search history.

(56) References Cited

U.S. PATENT DOCUMENTS

| 10,014,868 B1* | 7/2018 | Raj ........................... H04L 7/00 |
| 2013/0120073 A1* | 5/2013 | Okada ....................... H03L 5/00 331/1 A |
| 2014/0043105 A1* | 2/2014 | Zerbe .................. H03K 3/0322 331/50 |
| 2014/0254710 A1* | 9/2014 | Soe ........................ H03D 7/165 375/295 |

* cited by examiner

Primary Examiner — John W Poos
(74) Attorney, Agent, or Firm — Schwegman Lundberg & Woessner, P.A.

(57) ABSTRACT

Aspects of the present disclosure include systems, methods, devices, and circuits for correcting integral non-linearity using a hybrid phase interpolator. Consistent with some embodiments, a circuit comprises a first and second phase interpolator mixer connected to an injection-locked ring. The first phase interpolator mixer provides a first injection signal to the injection-locked ring based on a clock signal, and the second phase interpolator mixer provides a second injection signal to the injection-locked ring. The first and second injection signals have inverse step size profiles. The injection-locked ring generates a first and second output clock phase based on the first and second injection signals. In generating the first and second output clock phases, the injection-locked ring averages the step size profiles of the first and second injection signals.

20 Claims, 6 Drawing Sheets

US 10,333,533 B1

HYBRID PHASE INTERPOLATOR TO CORRECT INTEGRAL NON-LINEARITY

TECHNICAL FIELD

The present disclosure generally relates to integrated circuits (ICs). In particular, the present disclosure addresses a hybrid phase interpolator to correct integral non-linearity.

BACKGROUND

Phase interpolators are used to produce a varying output clock phase for a given fixed-phase input clock. Phase interpolators (also referred to as "phase rotators") can "rotate" or "step" the output clock phase anywhere (in discrete steps) between the edges that define a period of the input clock. Phase interpolators are often used in clock recovery operations.

It is often desirable for the phase step size of a phase interpolator to remain constant over every possible output phase location of the phase interpolator. For example, a constant step size in a phase interpolator can improve clock recovery jitter performance, improve interphase clock skews, and improve clock skew matching between multiple independent phase interpolators. Differential Non-Linearity (DNL) is a measure of the variation between any two adjacent phase interpolator steps. An ideal phase interpolator would have zero DNL (i.e., no variation). Integral Non-Linearity (INL) is a measure of the DNL integrated over N steps. In this way, INL shows how far the phase of a non-ideal phase interpolator deviates from the phase of an ideal phase interpolator over N steps.

Many conventional phase interpolator architectures suffer from varying degrees of DNL, which can lead to INL-induced phase differences between separate phase interpolators that are desired to match. The DNL of traditional phase interpolator architectures can also lead to rotational I-Q clock skews within any individual phase interpolator. Further, mixed waveforms are not perfectly sinusoidal, which leads to step size errors, and this issue can be exacerbated by digital-to-analog converter (DAC) current mirror errors that have voltage modulation on their drains as well as differential pairs that exhibit nonlinear behavior.

These conventional phase interpolators suffer from a "small-step/large-step" INL issue, where the phase interpolator takes large steps at one end of the rotation quadrant to make up for small steps at the opposite end of the rotation quadrant. Phase blending output buffers may be used to partially average out the effects of interphase skews in a phase interpolator. However, use of these phase blending output buffers does not improve INL errors between matched interpolators due to the "small steps/large steps" problem.

BRIEF DESCRIPTION OF THE DRAWINGS

Various ones of the appended drawings merely illustrate example embodiments of the present inventive subject matter and cannot be considered as limiting its scope.

DETAILED DESCRIPTION

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Aspects of the present disclosure address systems, methods, devices, and circuits for a hybrid phase interpolator that generates multiple clock phases using constant step sizes. By using constant step sizes, the hybrid phase interpolator corrects Integral Non-Linearity (INL) issues that occur in conventional phase interpolators. The hybrid phase interpolator comprises a phase interpolator mixer stage and an injection-locked ring stage.

In the phase interpolator mixer stage, injection signals are generated to drive an injection-locked ring in the injection-locked ring stage. A first-order INL improvement is achieved by correctly phasing the phase interpolator mixer currents, in such a way that both large steps and small steps are simultaneously applied to the downstream injection-locked ring. In particular, the injection signals are generated in the phase interpolator stage to have inverse step size profiles. A "step size profile" is a characteristic of the injection signals that describes a relationship between step size and phase position in the injection signal. Thus, the injection signals generated in the phase interpolator stage have inverse relationships between step size and phase position. In the injection-locked ring stage, the averaging properties in the injection-locked ring act on the step size curves to average out INL errors.

Figure 1:
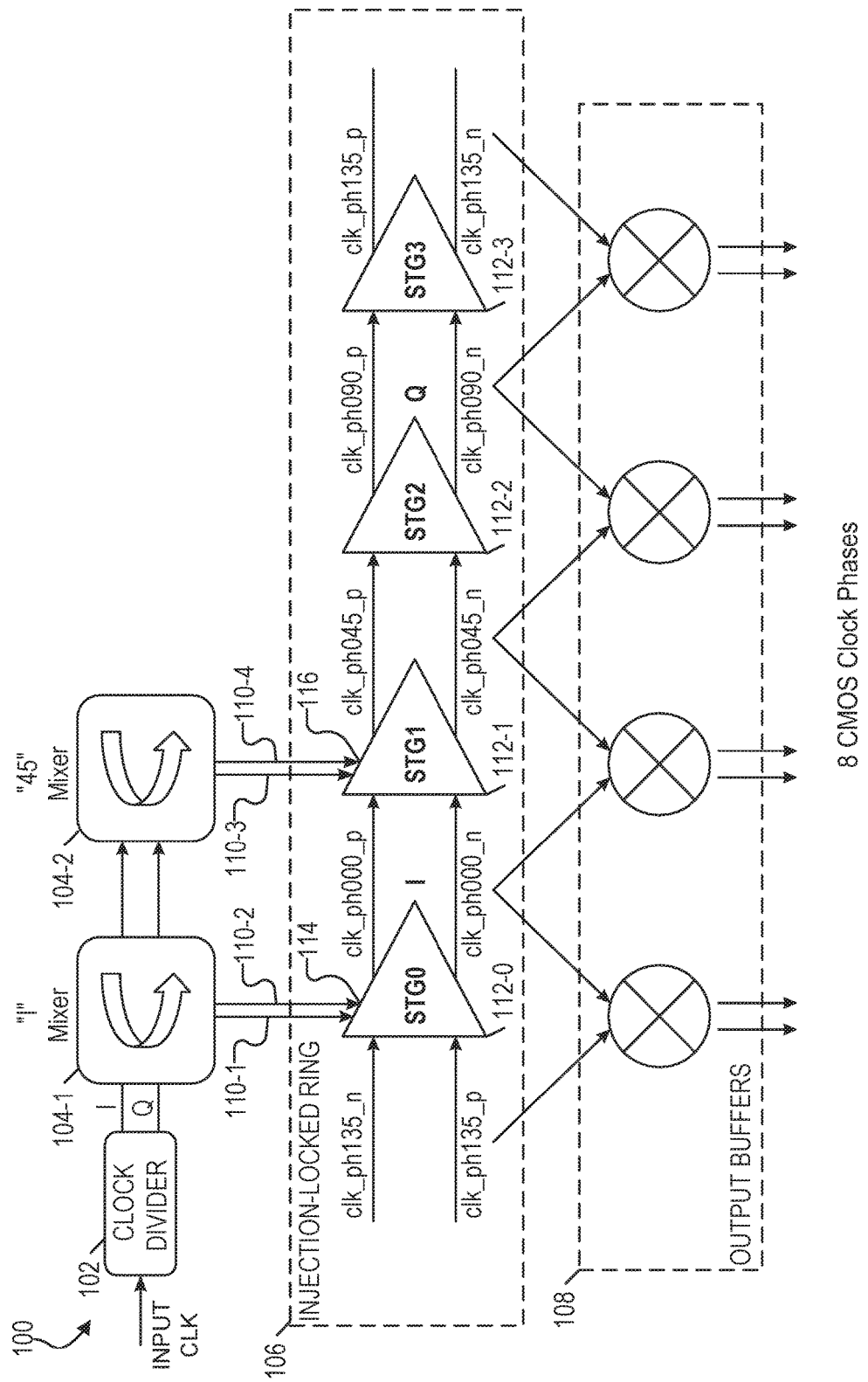
FIG. 1 is a circuit diagram illustrating a hybrid phase interpolator, according to some example embodiments.

With reference to FIG. 1, a hybrid phase interpolator 100 is shown, according to some example embodiments. As shown, the hybrid phase interpolator 100 comprises a clock divider 102, phase interpolator mixers 104-1 and 104-2, an injection-locked ring 106, and output buffers 108.

The clock divider 102 receives an input clock signal at its input. The clock divider 102 generates an in-phase (I) clock signal (also referred to herein as the "I clock") and a quadrature (Q) clock signal (also referred to herein as the "Q clock") based on the input clock signal. The I clock corresponds to the input clock signal and the Q clock corresponds to a 90-degree phase shift of the input clock signal. The clock divider 102 provides the I clock at a first output and provides the Q clock at a second output. Although not illustrated in FIG. 1, the clock divider 102 may further generate and provide an inverse I clock (referred to herein as "~I clock") and an inverse of the Q clock (referred to herein as "~Q clock").

The outputs of the clock divider 102 are connected to inputs of the phase interpolator mixers 104-1 and 104-2. The phase interpolator mixers 104-1 and 104-2 receive the I and Q clocks at their respective inputs. The phase interpolator mixers 104-1 and 104-2 use the I and Q clocks to generate injection signals to drive the injection-locked ring 106 based on different combinations of the I and Q clocks. The phase interpolator mixer 104-1 generates an injection signal 110-1 by mixing the clock signals according to a 100/0 mixing ratio (e.g., 100% of the I clock and 0% of the Q clock) to produce an injection signal that is in-phase with the I clock. The phase interpolator mixer 104-1 also generates an injection signal 110-2 that is the inverse of the injection signal 110-1 and is thereby in-phase with the ~I clock. The phase interpolator mixer 104-2 generates an injection signal 110-3 by mixing the clock signals according to a 50/50 mixing ratio (e.g., 50% of the I clock and 50% of the Q clock) to produce an injection signal that is phase offset with the I clock by 45 degrees. The phase interpolator mixer 104-2 also generates an injection signal 1104 that is an inverse of the injection signal 110-3.

Figure 2:
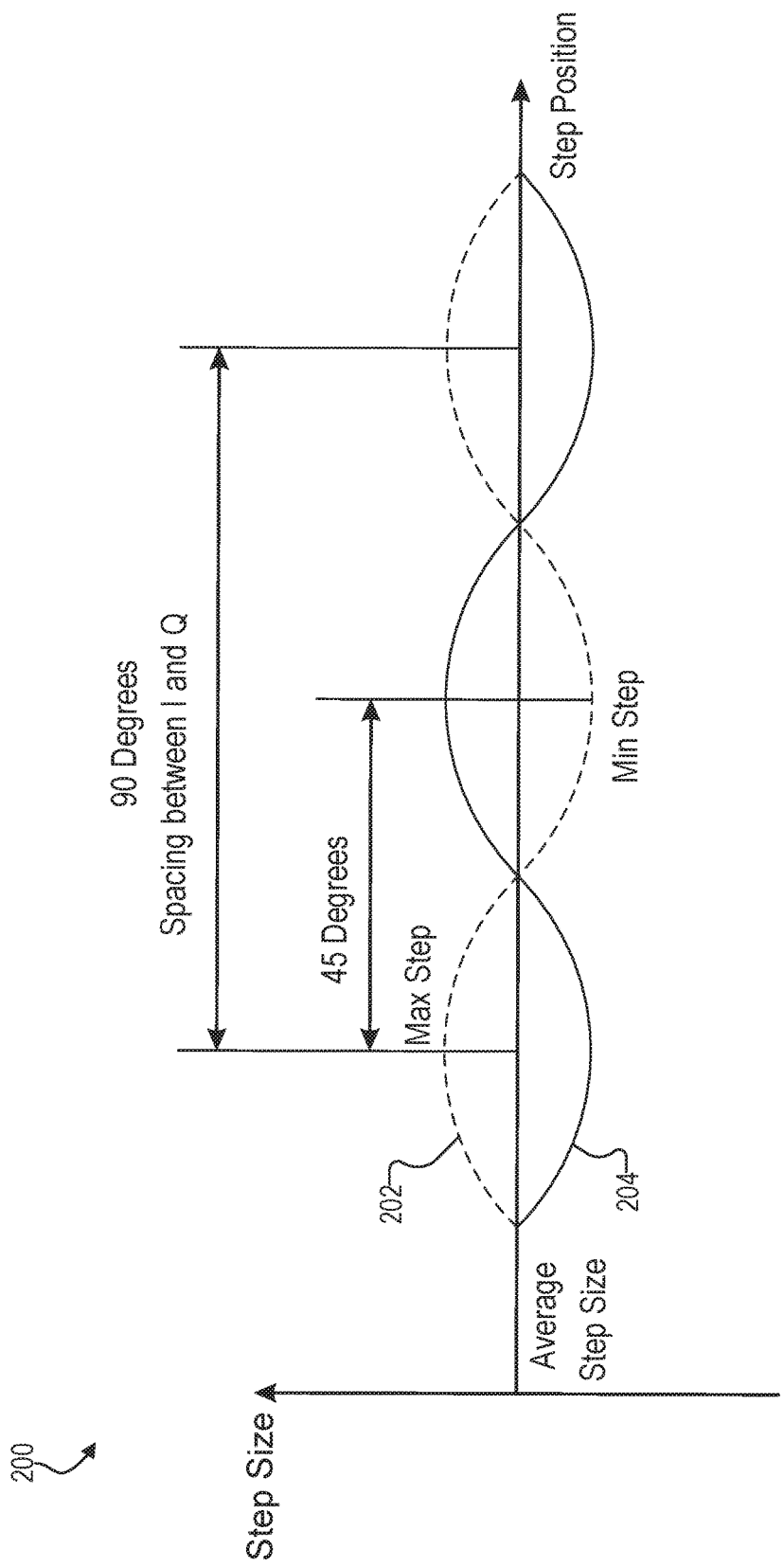
FIG. 2 is a plot illustrating step size curves associated with output signals of two phase interpolator mixer phase interpolators, which are included as part of the hybrid phase interpolators, according to some example embodiments.

The injection signals 110-1 and 110-3 generated by the phase interpolator mixers 104-1 and 104-2, respectively, have inverse step size profiles As a corollary, injection signals 110-2 and 110-4, which are simply the inverses of injection signals 110-1 and 110-3, also have inverse step size profiles. As used herein, a "step size profile" is a characteristic of an injection signal that describes a relationship between step size and phase position. As an example, FIG. 2 illustrates step size profiles of the injection signals output by the phase interpolator mixers 104-1 and 104-2, according to some example embodiments. More specifically, in FIG. 2, a graph 200 of step size versus phase position is illustrated. Step size curves 202 and 204 are plotted within the graph 200. Step size curve 202 represents the step size profile of the injection signal 110-1 output by the phase interpolator mixer 104-1 and step size curve 204 represents the step size profile of the injection signal 110-3 output by the phase interpolator mixer 104-2. As shown, the step size curve 202 is an inverse of the step size curve 204. That is, the relationship between step size and phase position in the injection signal 110-1 is the inverse of the relationship between step size and phase position in the injection signal 110-3.

Returning to FIG. 1, the phase interpolator mixers 104-1 and 104-2 provide the injection signals at their respective outputs. The outputs of the phase interpolator mixers 104-1 and 104-2 are connected to injection points of the injection-locked ring 106, and the injection-locked ring 106 generates output clock phases based on the injection signals provided by the phase interpolator mixers 104-1 and 104-2. By properly combining offset phase step curves in the phase interpolator mixers 104-1 and 104-2 with phase averaging provided by an injection-locked ring 106, a first order DNL and INL correction is achieved in the output clock phases. Rotational IQ skew errors generated by the phase interpolator mixers 104-1 and 104-2 are largely corrected in the injection-locked ring 106.

The injection-locked ring 106 comprises multiple delay stages. As shown, the injection-locked ring 106 comprises delay stages 112-0 to 112-3. Each of the delay stages 112-0 to 112-3 comprises at least one injection point.

The injection-locked ring 106 generates a characteristic oscillator signal. Each of the delay stages 112-0 to 112-3 contributes a finite delay, such that a time-delayed, or phase offset, version of the oscillator signal is established after each delay stage. Each of the delay stages 112-0 to 112-3 is of identical structure and configuration. Therefore, each of the delay stages 112-0 to 112-3 applies the same finite delay. The number of delay stages determines the amount of phase shift of each stage.

The oscillator signal undergoes a half cycle (0°-180°) total phase shift as it effectively 'travels' through the intervening delay stages in the first half of the injection-locked ring loop (e.g., clock signals Clk_0_p, Clk_45_p, Clk_90_p, Clk_135_p). Similarly, the oscillator signal undergoes the remaining half cycle of phase shift (180°-360°) as it effectively 'travels' the other half of the injection-locked ring loop (e.g., clock signals Clk_0_n, Clk_45_n, Clk_90_n, Clk_135_n). Thus, each half cycle is divided by n stage-to-stage phase shifts, or by a phase shift of 180°/n. Therefore, because four delay stages are employed, each delay stage would contribute a predetermined phase difference of 180°/4 or 45°.

As shown, the output of phase interpolator mixer 104-1 is connected to injection point 114 of the delay stage 112-0 and the output of phase interpolator mixer 104-2 is connected to injection point 116 of the delay stage 112-1. Accordingly, the injection signals 110-1 and 110-2 are injected into the injection point 114 of the delay stage 112-0, and the injection signals 110-3 and 110-4 are injected into the injection point 116.

The injection of the injection signals 110-1 and 110-2 to the injection point 114 causes the generated oscillator signal of the injection-locked loop to lock in both frequency and phase with the injection signals 110-1 and 110-2. Injection locking generally occurs when an oscillator operating at a certain frequency (e.g., the injection-locked ring 106) is disturbed by a second oscillator operating at a different but very close frequency (e.g., the injection signals 110-1 and 110-2) such that the coupling effects yield a locking of the first oscillator to the second oscillator. If the frequencies are sufficiently close and the coupling sufficiently strong, such injection locking will consistently occur in much the same manner that the vibrating strings of two instruments will eventually synchronize in vibration frequency if they are similarly tuned and drawn close enough together.

Because the injection signals 110-1 and 110-2 are injected at the first delay-stage 112-0, the injection-locked version of the oscillator signal resulting at the delay stage 112-0 is in-phase with the injection signals 110-1 and 110-2. Accordingly, after the first delay stage 112-0, the oscillator signal at the first half of the loop (i.e., Clk_0_p) and the other half of the loop (i.e., Clk_0_n) is not delayed with respect to the injection signals 110-1 and 110-2. Further, the injection-locked versions of the oscillator signal after the other delay stages would be accordingly referenced in phase to the first delay stage 112-0. For example, after the second delay stage 112-1, the oscillator signal at the first half of the loop (i.e., Clk_45_p) and the other half of the loop (i.e., Clk_45_n) is delayed by 45°. Similarly, after the third and fourth delay stages 112-2 and 112-3, the oscillator signal is delayed by 90° and 135°, respectively.

At injection point 114, as the phase interpolator mixer 104-1 rotates, large phase steps eventually turn into smaller steps. Correspondingly at injection point 116, as the phase interpolator mixer 104-2 rotates, small phase steps eventually turn into larger steps because, as noted above, the step size profile of the injection signal provided by the phase interpolator mixers 104-2 is the inverse of the step size profile of the injection signal provided the phase interpolator mixer 104-1. The injection-locked ring 106 rotates in such a manner that its instantaneous phase rotation value is equal to the average value of the two steps applied to the injection points 114 and 116, thereby producing the first-order step size correction, and corresponding INL improvement in the output clock phases generated by the injection-locked ring 106.

The injection-locked ring 106 is configured to be a phase-follower only; it does not inherently rotate. By not inherently rotating, the injection-locked ring 106 does not add any DNL, INL, or interphase skew errors back into the output clock phases.

The injection-locked ring 106 provides the output clock phases at its outputs. The outputs of the injection-locked ring 106 are connected to inputs of the output buffers 108. The output buffers 108 provide a second stage of skew correction through utilization of one or more blending techniques. The output buffers 108 further convert the output clock phases generated by the injection-locked ring 106 to complementary metal-oxide-semiconductor (CMOS) clock phases.

Figure 3:
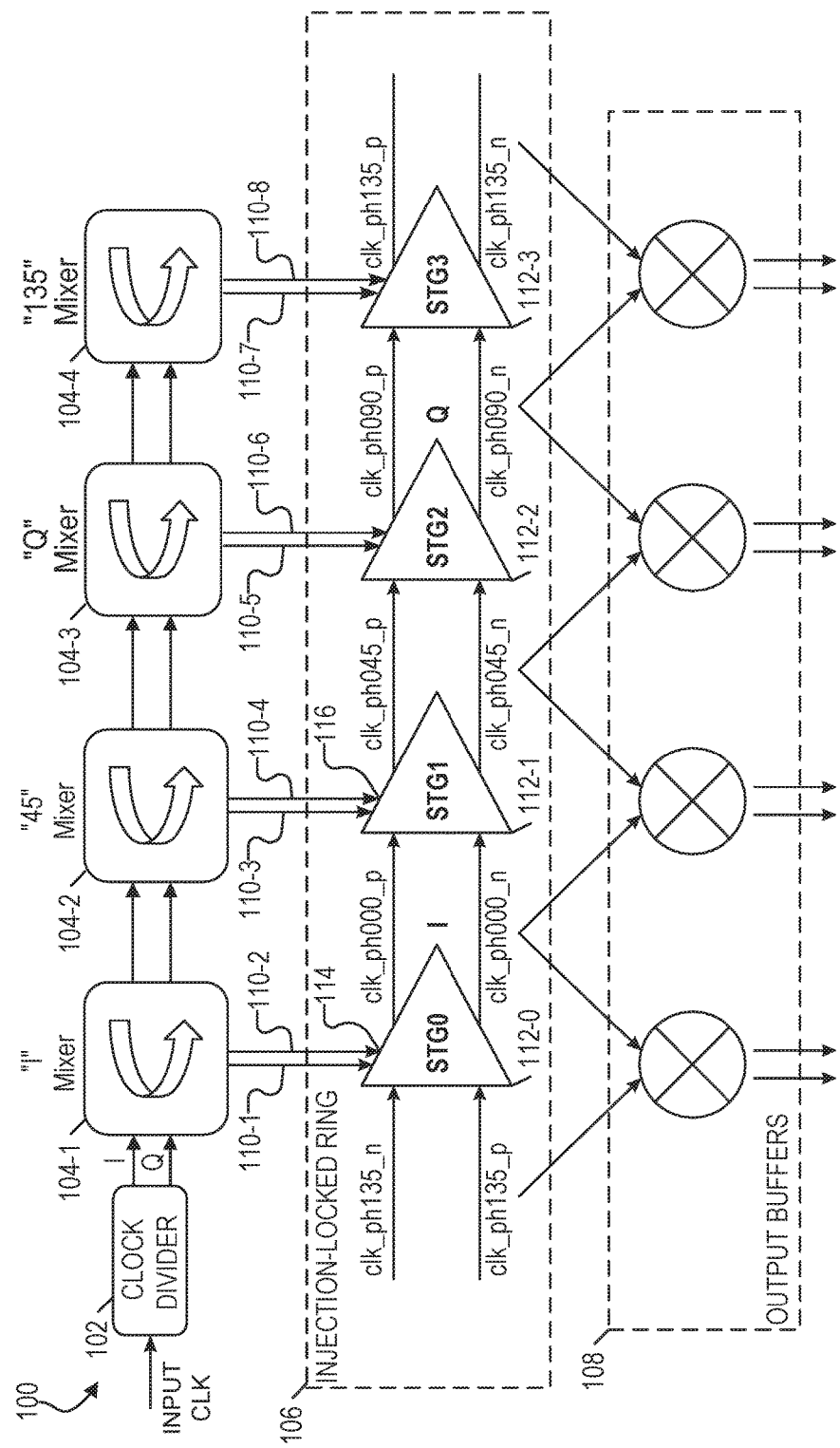
FIG. 3 is a circuit diagram illustrating a hybrid phase interpolator, according to some alternative example embodiments.

As shown in FIG. 3, the hybrid phase interpolator 100 may, in some embodiments, further include phase interpolator mixers 104-3 and 104-4. As with the phase interpolator mixers 104-1 and 104-2, the phase interpolator mixers 104-3 and 104-4 receive the I and Q clocks at their respective inputs and use the I and Q clocks to generate injection signals to drive the injection-locked ring 106 based on different combinations of the I and Q clocks. In particular, the phase interpolator mixer 104-3 generates an injection signal 110-5 by mixing the clock signals according to a 0/100 mixing ratio (e.g., 0% of the I clock and 100% of the Q clock) to produce an injection signal that is in-phase with the Q clock, which as noted above, is in quadrature with the I clock. The phase interpolator mixer 104-3 also generates an injection signal 110-7 that is the inverse of the injection signal 110-6 and is thereby in-phase with the ~Q clock. The phase interpolator mixer 104-4 generates an injection signal 110-7 by mixing the clock signals according to a 50/50 mixing ratio (e.g., 50% of the I clock and 50% of the Q clock) to produce an injection signal that is phase offset with the Q clock by 45 degrees and thus phase offset with the I clock by 135 degrees. The phase interpolator mixer 104-4 also generates an injection signal 110-8 that is the inverse of the injection signal 110-7. As with the injection signals 110-1 and 110-3, the injection signals 110-5 and 110-7 have inverse step profiles.

As shown, the phase interpolator mixers 104-3 and 104-4 provide the injection signals at their respective outputs. The outputs of the phase interpolator mixers 104-3 and 104-4 are connected to injection points of the injection-locked ring 106. In particular, the outputs of phase interpolator mixer 104-3 are connected to the injection point of delay stage 112-2 and the outputs of phase interpolator mixer 104-4 are connected to the injection point of delay stage 112-3. Accordingly, the injection signals 110-5 and 110-6 are injected into the injection point of the delay stage 112-2, and the injection signals 110-7 and 110-8 are injected into the injection point of the delay stage 112-3. The injection-locked ring 106 generates output clock phases based on the injection signals provided by the phase interpolator mixers 104-1 to 104-4 in the same manner as described above with reference to FIG. 1.

Figure 4A:
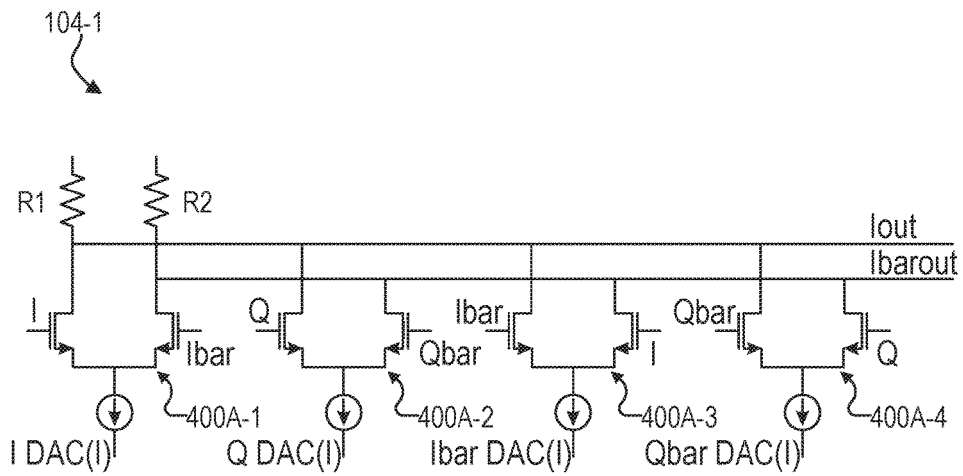
FIGS. 4A and 4B are circuit diagrams illustrating phase interpolator mixers, which are provided as part of the hybrid phase interpolator, according to some example embodiments.

FIG. 4A is a circuit diagram illustrating the phase interpolator mixer 104-1 included in the hybrid phase interpolator 100, according to some example embodiments. As illustrated in FIG. 4A, the phase interpolator mixer 104-1 includes differential amplifiers 400A-1 to 400A-4 and load resistors R1 and R2. Differential amplifier 400A-1 includes first and second n-channel metal-oxide-semiconductor (NMOS) transistors. As shown, the source nodes of the first and second NMOS transistors are connected to a digital-to-analog controller (DAC) for the I clock. Further, the drain nodes of the first and second NMOS transistors are connected to the resistors R1 and R2. In addition, the first NMOS transistor (e.g., left transistor) receives the I clock at its gate node and the second NMOS transistor (e.g., right transistor) receives an ~I clock at its gate node. In an embodiment, resistors R1 and R2 are of equal resistance.

In some embodiments, differential amplifiers 400A-2 to 400A-4 are similar in structure to differential amplifier 400A-1. However, as illustrated in FIG. 4A, (i) the first and second NMOS transistors receive different clocks at their respective gate nodes and (ii) the source nodes of the respective first and second NMOS transistors are connected to different DACs. For example, with regard to the differential amplifier 400A-2, (i) the source nodes of the first and second NMOS transistors are connected to a DAC associated with the Q clock and (ii) the first NMOS transistor receives a Q clock at its gate node and the second NMOS transistor receives a ~Q clock at its gate node. Further, with regard to the differential amplifier 400A-3, (i) the source nodes of the first and second NMOS transistors are connected to a DAC associated with the ~I clock and (ii) the first NMOS transistor receives an ~I clock at its gate node and the second NMOS transistor receives an I clock at its gate node. Lastly, with regard to the differential amplifier 400A-4, (i) the source nodes of the first and second NMOS transistors are connected to a DAC associated with the ~Q clock and (ii) the first NMOS transistor receives a ~Q clock at its gate node and the second NMOS transistor receives a Q clock at its gate node.

The source node of the first NMOS transistor of the differential amplifier 400A-1 is connected to the source node of the first NMOS transistor of each of the differential amplifiers 400A-2 to 400A-4. Similarly, the source node of the second NMOS transistor of the differential amplifier 400A-1 is connected to the source node of the second NMOS transistor of each of differential amplifiers 400A-2 to 400A-4.

Output injection signals (e.g., the injection signal 110-1 and an inverse of the injection signal 110-1) are interpolated between the clocks received at the first and second NMOS transistors of each of the differential amplifiers 400A-1 to 400A-4. Specifically, the interpolator mixer 104-1 generates the injection signals based on the currents at the I, ~I, Q, and ~Q DACs. Accordingly, the output injection signals can be positioned anywhere within a 2-data-bit interval.

Further, only two adjacent differential amplifiers are ever on at once: (i) differential amplifiers 400A-1 and 400A-2 or (ii) differential amplifiers 400A-2 and 400A-3 or (iii) differential amplifiers 400A-3 and 400A-4 or (iv) differential amplifiers 400A-4 and 400A-1. Therefore, because the input clocks between differential amplifiers are in quadrature, the output injection signals will also be in quadrature. For example, if the I DAC current (i.e., differential amplifier 400A-1) is nonzero but the Q DAC current (i.e., differential amplifier 400A-2) is zero, then the injection signal 110-1 will be aligned with the I input clock. Similarly, if the I DAC current is zero but the Q DAC current is nonzero, then the injection signal 110-1 will be aligned with the Q input clock. However, if (i) the I DAC current is equal to the Q DAC current, then the injection signal 110-1 will be phase-aligned half-way between the I and Q input clocks. In other words, as the I DAC current is gradually decreased and the Q DAC current is gradually increased, that phase of the injection signal moves from being aligned with the I input clock towards being aligned with the Q input clock. In this manner, the phase interpolator mixer 104-1 generates a new "interpolated" output clock as the injection signal 110-1. Further, as mentioned previously above, the inverse of the injection signal 110-1 will include the same phase as the injection signal 110-1 but will be of opposite polarity.

Figure 4B:
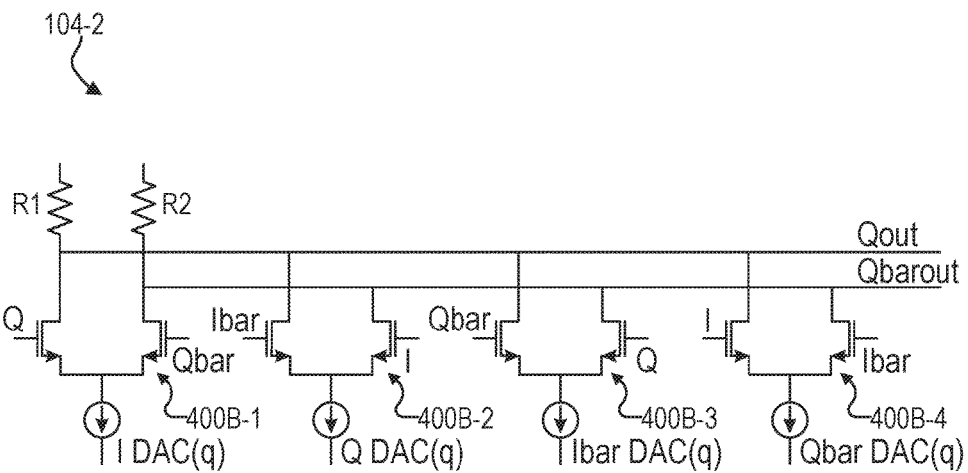

FIG. 4B is a circuit diagram illustrating the phase interpolator mixer 104-2 included in the hybrid phase interpolator 100, according to some example embodiments. The phase interpolator mixer 104-2 is similar in structure to the phase interpolator mixer 104-1 except that the differential amplifiers 400B-1 to 400B-4 receive different input clocks than the differential amplifiers 400A-1 to 400A-4. For example, with regard to the differential amplifier 400B-1, the first NMOS transistor receives a Q clock at its gate node and the second NMOS transistor receives a ~Q clock at its gate node. Further, with regard to the differential amplifier 400B-2, the first NMOS transistor receives an ~I clock at its gate node and the second NMOS transistor receives an I clock at its gate node. Further, with regard to the differential amplifier 400B-3, the first NMOS transistor receives a ~Q clock at its gate node and the second NMOS transistor receives a Q clock at its gate node. Lastly, with regard to the differential amplifier 400B-4, the first NMOS transistor receives an I clock at its gate node and the second NMOS transistor receives an ~I clock at its gate node.

Figure 5:
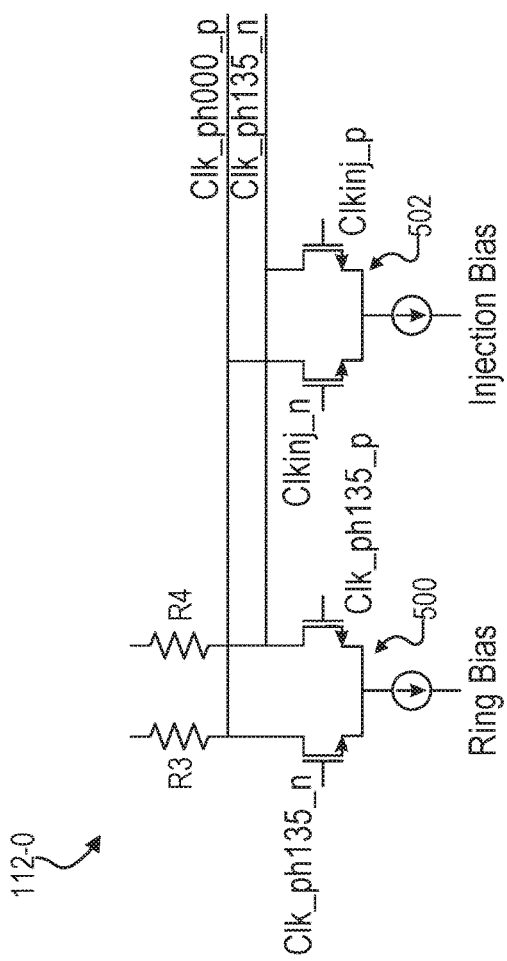
FIG. 5 is a circuit diagram illustrating a delay stage of an injection-lock ring, which is provided as part of the hybrid phase interpolator, according to some example embodiments.

FIG. 5 is a circuit diagram illustrating a delay stage of the injection-locked ring 106, which is provided as part of the hybrid phase interpolator 100, according to some example embodiments. Specifically, FIG. 5 depicts the first delay stage 112-0. The first delay stage 112-0 includes differential amplifiers 500 and 502 and load resistors R3 and R4. In some embodiments, resistors R3 and R4 are of equal resistance. In an embodiment, differential amplifier 500 includes first and second NMOS transistors.

As further illustrated in FIG. 5, the source nodes of the first and second NMOS transistors are connected to a bias current for the injection-locked ring 106. Further, the drain nodes of the first and second NMOS transistors are connected to the resistors R3 and R4. In addition, the first NMOS transistor (e.g., left transistor) receives clock signal Clk_135_n at its gate node and the second NMOS transistor (e.g., right transistor) receives clock signal Clk_135_p at its gate node. In an embodiment, with regard to the differential amplifier 502, (i) the source nodes of the first and second NMOS transistors are connected to an injection bias current and (ii) the first NMOS transistor receives an inverse of the injection signal 110-1 (e.g., ~I clock) at its gate node and the second NMOS transistor receives the injection signal 110-1 (e.g., I clock) at its gate node.

Further. (i) the source node of the first NMOS transistor of the differential amplifier 500 is connected to the source node of the first NMOS transistor of the differential amplifier 502 and (ii) the source node of the second NMOS transistor of the differential amplifier 500 is connected to the source node of the second NMOS transistor of the differential amplifiers 502. In an embodiment, the first delay stage 112-0 is able to lock the clock signals Clk_0_p and Clk_0_n to the injection signals (i.e., the injection signal 110-1 and the inverse of the injection signal 110-1) based on the ring and injection bias currents.

The ring oscillator's bias current is typically calibrated along with the value of the load resistors (i.e., R3 and R4) through a digital calibration loop at startup, so as to force the ring oscillator to have a natural oscillation frequency which is as close to the injection frequency as possible. This places the ring oscillator, when injection-locked, within the center of its lock range. If the injection signal frequency is increased (or decreased) beyond a certain value, above or below this calibrated natural ring oscillation frequency, then the loop will lose lock since the ring oscillator is trying to naturally oscillate at a point which is too far away from the driving injection frequency. The ring's natural oscillation frequency depends on the load resistance and capacitance at the output of each delay stage.

Further, the ring oscillator's voltage swing and loop gain depends partly on the bias current and load resistor values. The injection bias current is typically some fraction of the calibrated ring oscillator bias, having sufficient strength to allow the injection differential pair (e.g., 500) to "pull" the ring oscillator stage into phase alignment with the injection signals (i.e., the injection signal 110-1 and the inverse of the injection signal 110-1). The injection bias must be strong enough to allow the injection signal to lock the ring oscillator (stronger injection biases help maximize the lock range). For example, the ring bias may range anywhere from several hundred microamps (e.g., for a 500 MHz natural frequency) to several milliamps (e.g., for a 5 GHz to 10 GHz natural frequency). Further, a typical value for the injection bias would be one-quarter of the respective ring bias. Consistent with some embodiments, the other delay stages 112-1 to 112-3 include circuit structures essentially identical to the delay stage 112-0. However, the other delay stages do not receive the same injection signals as the delay stage 112-0. For example, as noted above, the delay stage 112-1 receives the injection signal 110-2.

Figure 6:
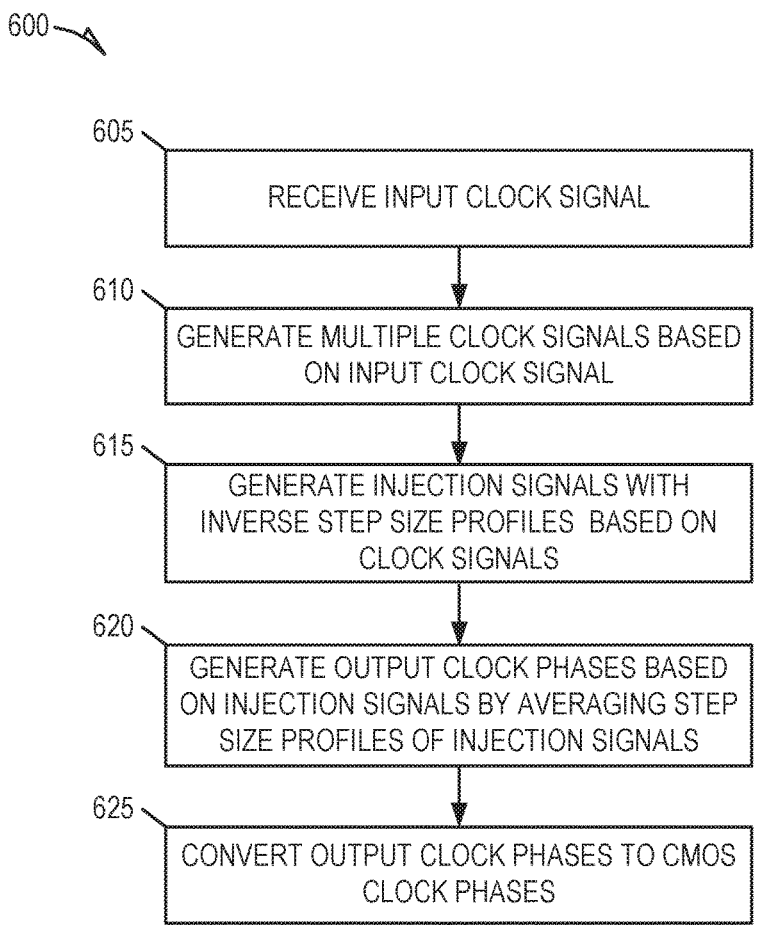
FIG. 6 is a flow diagram illustrating operations of the hybrid phase interpolator in performing a method for generating multiple clock phases using constant step sizes, according to some example embodiments.

FIG. 6 is a flow diagram illustrating operations of the hybrid phase interpolator 100 in performing a method 600 for generating multiple clock phases using constant step sizes, according to some example embodiments. At operation 605, the clock divider 102 receives an input clock signal. The input clock signal may be generated by a clock generator.

At operation 610, the clock divider 102 generates at least two clock signals based on the input clock signal. For example, the clock divider may generate a first clock signal that is in-phase with the input clock signal (e.g., the I clock), and a second clock signal that is phase offset with the input clock signal by 90 degrees (e.g., the Q clock). In light of the phase shift, the first and second clock signal are in quadrature with one another. The clock divider may further generate a third clock signal that is an inverse of the first clock signal (e.g., the ~I clock), and a fourth clock signal that is an inverse of the second clock signal (e.g., the ~Q clock).

At operation 615, the phase interpolator mixers 104-1 to 104-4 generate injection signals based on the first and second clock signal generated by the clock divider 102. In generating the injection signals, the phase interpolator mixer 104-1 generates a first injection signal (e.g., injection signal 110-1) that is in-phase with the first clock signal. The phase interpolator mixer 104-1 generates the first injection signal by combining the first and second clock signal according to a first combination. For example, the phase interpolator mixer 104-1 may generate the first injection signal by combining the first and second clock signals at a 100/0 mixing ratio (e.g., 100% first clock signal and 0% second clock signal).

The phase interpolator mixer 104-2 generates a second injection signal (e.g., injection signal 110-3) that corresponds to a phase shift of the first clock signal (e.g., a 45-degree phase shift). The phase interpolator mixer 104-2 generates the second injection signal by combining the first and second clock signal according to a second combination. For example, the phase interpolator mixer 104-2 may generate the second injection signal that corresponds to a 45-degree phase shift of the first clock signal by combining the first and second clock signals at a 50/50 mixing ratio (e.g., 50% first clock signal and 50% second clock signal). By generating the injection signals in this manner, the first and second injection signals have a 45-degree phase difference.

In addition, by generating the first and second injection signals in this manner, the first injection signal and the second injection signal have inverse step size profiles. As noted above, the step size profile describes a relationship between step size and phase position. Thus, the relationship between step size and phase position in the first injection signal is the inverse of the relationship between step size and phase position in the second injection signal.

Consistent with some embodiments, the phase interpolator mixer 104-1 may further generate a third injection signal (e.g., injection signal 110-2) that is an inverse of the first injection signal, and the phase interpolator mixer 104-2 may further generate a fourth injection signal (e.g., injection signal 110-4) that is an inverse of the second injection signal.

At operation 620, the injection-locked ring 106 generates output clock phases based on the injection signals. In generating the output clock phases, the injection-locked ring 106 averages the step size profiles of the injection signals. As noted above, the first and second injection signals have inverse step size profiles. Thus, by averaging the inverse step size profiles, the injection-locked ring 106 generates output clock phases using constant step sizes. The output clock phases may include at least a first and second output clock phase that are offset by 45 degrees. The output clock phases further include: a third output clock phase that is offset with first output clock phase by 90 degrees; a fourth output clock phase that is offset with the first output clock phase by 135 degrees; a fifth output clock phase that is offset with the first output clock phase by 180 degrees; a sixth output clock phase that is offset with the first output clock phase by 225 degrees; a seventh output clock phase that is offset with the first output clock phase by 270 degrees; and an eighth output clock phase that is offset with the first output clock phase by 315 degrees.

At operation 625, the output buffers 108 convert the output clock phases to complementary metal-oxide-semiconductor (CMOS) clock phases. In converting the output clock phases, the output buffers 108 may utilize blending techniques to reduce static and rotating skews in the CMOS clock phases.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent, to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

What is claimed is:

1. A phase interpolator circuit comprising:
    a first phase interpolator mixer to generate a first injection signal based on a clock signal, the first injection signal being in-phase with the clock signal;
    a second phase interpolator mixer to generate a second injection signal based on the clock signal, the second injection signal corresponding to a phase shift of the clock signal, the first and second injection signals having inverse step size profiles, each step size profile describing a relationship between step size and phase position; and
    an injection-locked ring connected to the first and second interpolators, the injection-locked ring to generate a first output clock phase and second output clock phase based on the first and second injection signals, the generating of the first and second output clock phases including averaging the inverse step size profiles of the first and second injection signals.

2. The phase interpolator circuit of claim 1, wherein:
    the clock signal is a first clock signal;
    the first phase interpolator mixer generates the first injection signal based on a first combination of the first clock signal and a second clock signal; and
    the second phase interpolator mixer generates the second injection signal based on a second combination of the first clock signal and the second clock signal.

3. The phase interpolator circuit of claim 2, further comprising:
    a clock divider to generate the first and second clock signals, the first clock signal being in-phase with an input clock signal received by the clock divider, the second clock signal being in quadrature with the input clock signal, the clock divider being connected to the first and second phase interpolator mixers.

4. The phase interpolator circuit of claim 2, wherein the first and second clock signals have a 90-degree phase offset.

5. The phase interpolator circuit of claim 2, wherein the phase shift is a first phase shift, and further comprising:
a third phase interpolator mixer to generate a third injection signal based on a third combination of the first clock signal and the second clock signal the third injection signal corresponding to a second phase shift of the clock signal; and
a fourth phase interpolator mixer to generate a fourth injection signal based on a fourth combination of the first clock signal and second clock signal, the fourth injection signal corresponding to a third phase shift of the clock signal, the third and fourth injection signals having inverse step size profiles.

6. The phase interpolator circuit of claim 5, wherein:
the first phase shift is 45 degrees;
the second phase shift is 90 degrees; and
the third phase shift is 135 degrees.

7. The phase interpolator circuit of claim 5, wherein the injection-locked ring further comprises:
a first delay stage having a first injection point connected to the first phase interpolator mixer, the first injection point to receive the first injection signal;
a second delay stage having a second injection point connected to the second phase interpolator mixer, the second injection point to receive the second injection signal;
a third delay stage having a third injection point connected to the third phase interpolator mixer, the third injection point to receive the third injection signal; and
a fourth delay stage having a fourth injection point connected to the fourth phase interpolator mixer, the fourth injection point to receive the fourth injection signal,
wherein the injection-locked ring generates the first output clock phase, the second output clock phase, a third output clock phase, and a fourth output clock phase by averaging the step size profiles of the first, second, third, and fourth injection signals.

8. The phase interpolator circuit of claim 1, further comprising:
a plurality of output buffers connected to the injection-locked ring, the plurality of output buffers to convert the first output clock phase to a first complementary metal-oxide-semiconductor (CMOS) clock phase, and to convert the second output clock phase to a second CMOS clock phase.

9. The phase interpolator circuit of claim 1, wherein:
the first phase interpolator mixer generates a third injection signal based on the clock signal;
the third injection signal is an inverse of the first injection signal;
the second phase interpolator mixer generates a fourth injection signal based on the clock signal; and
the fourth injection signal is an inverse of the second injection signal.

10. The phase interpolator circuit of claim 1, wherein the second injection signal is based on a 45-degree phase shift of the clock signal.

11. The phase interpolator circuit of claim 1, wherein the injection-locked ring is configured as a phase-follower.

12. A method comprising:
generating a first injection signal based on a clock signal, the first injection signal being in-phase with the clock signal;
generating a second injection signal based on the clock signal the second injection signal corresponding to a phase shift of the clock signal, the first and second injection signals having inverse step size profiles, each step size profile describing a relationship between step size and phase position; and
generating first and second output clock phases based on the first and second injection signals, the generating of the first and second output clock phases comprising using an injection-locked ring to average the inverse step size profiles of the first and second injection signals.

13. The method of claim 12, wherein:
the clock signal is a first clock signal;
the generating of the first injection signal comprises mixing the first and second clock signals according to a first combination, the first and second clock signals being out-of-phase; and
the generating of the second injection signal comprises mixing the first and second clock signals according to a second combination.

14. The method of claim 13, wherein the phase shift is a first phase shift, and further comprising:
generating a third injection signal based on a third combination of the first clock signal and the second clock signal, the third injection signal corresponding to a second phase shift of the clock signal; and
generating a fourth injection signal based on a fourth combination of the first clock signal and second clock signal, the fourth injection signal corresponding to a third phase shift of the clock signal, the third and fourth injection signals having inverse step size profiles.

15. The method of claim 14, wherein:
the first phase shift is 45 degrees;
the second phase shift is 90 degrees; and
the third phase shift is 135 degrees.

16. The method of claim 15, further comprising:
generating a third output clock phase based on the first, second, third, and fourth injection signals; and
generating a fourth output clock phase based on the first, second, third, and fourth injection signals,
wherein the generating of the first, second, third, and fourth output clock phases comprises averaging the step size profiles of the first, second, third, and fourth injection signals.

17. The method of claim 12, further comprising:
converting the first output clock phase to a first complementary metal-oxide-semiconductor (CMOS) clock phase; and
converting the second output clock phase to a second CMOS clock phase.

18. The method of claim 12, further comprising:
the first phase interpolator mixer has a third phase interpolator mixer output;
generating a third injection signal based on the clock signal, the third injection signal being an inverse of the first injection signal; and
generating a fourth injection signal based on the clock signal, the fourth injection signal being an inverse of the second injection signal.

19. The method of claim 12, wherein:
the second injection signal is based on a 45-degree phase shift of the clock signal; and the first and second output clock phases have a phase offset of 45 degrees.

20. A device comprising:

a clock divider having a clock divider input, a first clock divider output, and a second clock divider output, the clock divider to receive an input clock signal at the clock divider input, the clock divider to provide a first clock signal at the first clock divider output based on the input clock signal, the first clock signal being in-phase with the input clock signal, the clock divider further to provide a second clock signal at the second clock divider output based on a 90-degree phase shift of the input clock signal;

a first phase interpolator mixer having a first phase interpolator mixer output, the first phase interpolator mixer to provide a first injection signal at the first phase interpolator mixer output by mixing the first and second clock signals according to a first combination, the first injection signal being in-phase with the first clock signal;

a second phase interpolator mixer having a second phase interpolator mixer output, the second phase interpolator mixer to provide a second injection signal at the second phase interpolator mixer output by mixing the first and second clock signals according to a second combination, the second injection signal corresponding to a 45-degree phase shift of the first clock signal, the first and second injection signals having inverse step size profiles, each step size profile describing a relationship between step size and phase position; and an injection-locked ring comprising:

a first delay stage having a first injection point connected to the first phase interpolator mixer output, the first injection point to receive the first injection signal; and a second delay stage having a second injection point connected to the second phase interpolator mixer, the second injection point to receive the second injection signal, the injection-locked ring to generate a first output clock phase and second output clock phase based on the first and second injection signals, the generating of the first and second output clock phases including averaging the step size profiles of the first and second injection signals, the first and second output clock phases have a 45-degree phase difference.

* * * * *